US010815584B2

(12) United States Patent
Özyilmaz et al.

(10) Patent No.: US 10,815,584 B2
(45) Date of Patent: Oct. 27, 2020

(54) ORDERED GROWTH OF LARGE CRYSTAL GRAPHENE BY LASER-BASED LOCALIZED HEATING FOR HIGH THROUGHPUT PRODUCTION (71) Applicant: National University of Singapore, Singapore (SG)

(72) Inventors: Barbaros Özyilmaz, Singapore (SG); Chee Tat Toh, Singapore (SG)

(73) Assignee: National University of Singapore, Singapore (SG)

( * ) Notice: Subject to any disclaimer, the term of this patent is extended or adjusted under 35 U.S.C. 154(b) by 110 days.

(21) Appl. No.: 15/032,219

(22) PCT Filed: Nov. 17, 2014

(86) PCT No.: PCT/SG2014/000540
§ 371 (c)(1),
(2) Date: Apr. 26, 2016

(87) PCT Pub. No.: WO2015/072927
PCT Pub. Date: May 21, 2015

(65) Prior Publication Data
US 2016/0258081 A1 Sep. 8, 2016

Related U.S. Application Data (60) Provisional application No. 61/904,993, filed on Nov. 15, 2013.

(51) Int. Cl.
*C30B 29/02* (2006.01)
*C30B 25/10* (2006.01)
(Continued)

(52) U.S. Cl.
CPC .......... *C30B 25/105* (2013.01); *C01B 32/186* (2017.08); *C01B 32/188* (2017.08);
(Continued)

(58) Field of Classification Search
None
See application file for complete search history.

(56) References Cited

U.S. PATENT DOCUMENTS 4,986,214 A 1/1991 Zumoto et al.
5,308,651 A 5/1994 Ohta et al.
(Continued)

FOREIGN PATENT DOCUMENTS

CN 103288073 9/2013
JP 2006035174 A 2/2006
(Continued)

OTHER PUBLICATIONS

Wei et al "Laser direct growth of graphene on silicon substrate" Appl Phys Lett 100 (Jan. 10, 2012).*
(Continued)

*Primary Examiner* — Mandy C Louie
(74) *Attorney, Agent, or Firm* — Hamilton, Brook, Smith & Reynolds, P.C.

(57) ABSTRACT

A method of making an ordered graphene structure includes exposing a substrate to a laser beam to locally melt a portion of the substrate, exposing the substrate to a laser beam in the presence of a carbon source, to form a nucleation site for a graphene crystal, and either a) moving either the substrate or the laser beam relative to the other, or b) decreasing the laser beam power, in order to increase the size of the graphene crystal, thereby forming an ordered graphene structure. The ordered structure can be a plurality of columns, hexagons, or quadrilaterals. Each ordered structure can have a single crystal of graphene. A polymer coating can be formed on the ordered graphene structure to form a coated graphene structure.

12 Claims, 9 Drawing Sheets (51) Int. Cl.
| | |
|---|---|
| *C30B 13/24* | (2006.01) |
| *H01L 29/16* | (2006.01) |
| *C01B 32/188* | (2017.01) |
| *C01B 32/186* | (2017.01) |
| *C30B 25/12* | (2006.01) |
| *C30B 25/18* | (2006.01) |
| *C30B 29/60* | (2006.01) |
| *B82Y 40/00* | (2011.01) |

(52) U.S. Cl.
CPC .............. *C30B 13/24* (2013.01); *C30B 25/12* (2013.01); *C30B 25/18* (2013.01); *C30B 29/02* (2013.01); *C30B 29/605* (2013.01); *H01L 29/1606* (2013.01); *B82Y 40/00* (2013.01)

(56) References Cited

U.S. PATENT DOCUMENTS

| | | | |
|---|---|---|---|
| 5,731,046 A | 3/1998 | Mistry | |
| 6,219,469 B1 | 4/2001 | Minakata et al. | |
| 7,850,863 B2 | 12/2010 | Zenasni | |
| 8,026,165 B2 | 9/2011 | Zenasni | |
| 8,133,548 B2 | 3/2012 | Zenasni | |
| 8,231,797 B2 | 7/2012 | Jousseaume et al. | |
| 8,512,669 B2 * | 8/2013 | Hauck .................... | B82Y 30/00 423/445 B |
| 8,617,669 B1 | 12/2013 | Quick et al. | |
| 8,617,965 B1 | 12/2013 | Quick et al. | |
| 8,623,466 B2 | 1/2014 | Zenasni | |
| 8,637,118 B2 | 1/2014 | Zenasni | |
| 8,999,440 B2 | 4/2015 | Zenasni et al. | |
| 9,159,550 B2 | 10/2015 | Zenasni | |
| 2002/0063673 A1 | 5/2002 | Kawai | |
| 2006/0018820 A1 | 1/2006 | Little | |
| 2009/0322319 A1 | 12/2009 | Kreupl | |
| 2010/0012032 A1 | 1/2010 | Chen | |
| 2010/0247801 A1 | 9/2010 | Zenasni | |
| 2011/0030879 A1 | 2/2011 | Veerasamy | |
| 2011/0151278 A1 | 6/2011 | Gurney et al. | |
| 2011/0195207 A1 | 8/2011 | Hong et al. | |
| 2011/0244662 A1 | 10/2011 | Lee et al. | |
| 2012/0021249 A1 | 1/2012 | Shin et al. | |
| 2012/0040145 A1 | 2/2012 | Zenasni et al. | |
| 2012/0048195 A1 * | 3/2012 | Lin ........................ | B82Y 30/00 118/712 |
| 2012/0068161 A1 * | 3/2012 | Lee ........................ | B82Y 30/00 257/29 |
| 2012/0088039 A1 | 4/2012 | Yu et al. | |
| 2012/0118368 A1 | 5/2012 | Huang et al. | |
| 2012/0132353 A1 | 5/2012 | Hauck | |
| 2012/0156424 A1 | 6/2012 | Chen et al. | |
| 2013/0127023 A1 | 5/2013 | Zenasni | |
| 2013/0202813 A1 | 8/2013 | Chueh et al. | |
| 2013/0240033 A1 | 9/2013 | Jeon et al. | |
| 2013/0323158 A1 * | 12/2013 | Xu ........................ | B82Y 30/00 423/448 |
| 2014/0239461 A1 | 8/2014 | Delabie et al. | |
| 2016/0148633 A1 | 5/2016 | Hasegawa | |
| 2016/0340783 A1 | 11/2016 | Lu | |
| 2016/0340797 A1 | 11/2016 | Özyilmaz | |

FOREIGN PATENT DOCUMENTS

| | | |
|---|---|---|
| JP | WO2011021715 A1 | 1/2013 |
| JP | 2013513544 A | 4/2013 |
| KR | 20120045100 A | 5/2012 |
| WO | 2011021715 A1 | 2/2011 |
| WO | WO 2012/044284 A1 | 4/2012 |
| WO | 2012/164259 | 12/2012 |
| WO | 2013/141817 | 9/2013 |
| WO | 2013138216 A1 | 9/2013 |
| WO | 2014027529 A1 | 2/2014 |
| WO | WO 2015/072927 A1 | 5/2015 |
| WO | WO 2015/119572 A1 | 8/2015 |

OTHER PUBLICATIONS

Wei et al "Laser direct syntehsis of graphene on quartz" Carbon 53 (Nov. 20, 2012) 374-379.*
Grantab et al "Anomalous strength characteristics of tilt grain boundaries in graphene" Science vol. 330, Is 6006 (Nov. 12, 2010) 946-948.*
Baeri et al "Segregation effects in cu implanted si after laser pulse melting" Phys Rev Lett vol. 41, No. 18 (Oct. 30, 1978).*
Nie et al "origin of the mosaicity in graphene grown on Cu(111)" Phy Rev B84 (2011).*
Choi, I., et al., "Laser-Induced Solid-Phase Doped Graphene", 8(8): 7671-7677 (2014).
Dhar, S., et al., "A new route to graphene layers by selective laser ablation", *AID Advances*, 1, 022109 (2011).
International Search Report and Written Opinion of the International Searching Authority dated Feb. 5, 2015 for International Application No. PCT/SG2014/000540 entitled "Ordered Growth of Large Crystal Graphene by Laser-Based Localized Heating for High Throughput Production".
International Search Report and Written Opinion of the International Searching Authority dated Apr. 16, 2015 for International Application No. PCT/SG2014/000029 entitled "Method of Pulsed Laser-Based Large Area Graphene Synthesis on Metallic and Crystalline Substrates".
Kumar, P., "Laser flash synthesis of graphene and its inorganic analogues: An innovative breakthrough with immense promise," RCS Advances, 2013, 3, 11987-12002.
Lee, J-H., et al., "Wafer-Scale Growth of Single-Crystal Monolayer Graphene on Reusable Hydrogen-Terminated Germanium", *Science*, 344: 286-289 (Apr. 18, 2014).
Li, X., et al. "Large-area synthesis of high-quality and uniform graphene films on copper foils," Science 324, 1312-14 (2009).
Park, J.B, et al., "Fast growth graphene patterns by laser direct writing," Applied Physics Letters 98, 123109-1-3 (2011).
Park, J.B. et al., "Transparent interconnections formed by rapid single-step fabrication of graphene patterns," Applied Physics Letters 99, 053103-1-3 (2011).
Wang, K., "Laser Based Fabrication of Graphene", *Intech*, 77-95 (2013).
Wei, D., et al., "Laser direct synthesis of graphene on quartz", *Carbon*, 53 (2013) 374-379.
Fan, L. et al. "Laser direct writing graphene patterns on SiO2/Si substrates" Proc. SPIE 8608, Laser-based Micro- and Nanopackaging and Assembly VII, 86060J (Mar. 15, 2013) doi101117122001405 ISSN 0277786X ISBN 9781510607538 p. 86080J XP055383298.
Koh, A. et al. "Cooling rate and energy dependence of pulsed laser fabricated graphene on nickel at reduced temperature" Applied Physics Letters A I P Publishing LLC US (Sep. 14, 2010) vol. 97, No. 11, doi10106313489993 ISSN 00036951 pp. 114102 114102 XP012136930.
Wang G. et al. "Direct Growth of Graphene Film on Germanium Substrate" Scientific Reports, vol. 3 : 2465 (2013) doi101038srep02465 XP055267329.
International Preliminary Report on Patentability dated Aug. 9, 2016 for International Application No. PCT/SG2015/000029 entitled "Method of Pulsed Laser-Based Large Area Graphene Synthesis on Metallic and Crystalline Substrates".
International Preliminary Report on Patentability dated May 17, 2016 for International Application No. PCT/SG2014/000540 entitled "Ordered Growth of Large Crystal Graphene by Laser-Based Localized Heating for High Throughput Production".
Suemitsu, M. et al. "Epitaxial graphene on silicon substrates" Journal of Physics D Applied Physics Institute of Physics Publishing Ltd GB (Sep. 2, 2010) vol. 43, No. 37, doi101088002237274337374012 ISSN 00223727 p. 374012 XP020196821.
Bunch, et al., "Impermeable Atomic Membranes from Graphene Sheets", Nano Letters, vol. 8, No. 8, 2008, pp. 2458-2462.
Lee et al., "Laser-Synthesized Epitaxial Graphene", ACS Nano, 2010, 4, 12, pp. 7524-7530.

(56) References Cited

OTHER PUBLICATIONS

Hwang et al., "Electrical characteristics of wrinkle-free graphene formed by laser graphitization of 4H—SiC", Applied Physics Letters 99, 082111, 2011.
Kim et al., "Modeling of the self-limited growth in catalytic chemical vapor deposition of graphene", New Journal of Physics, 15, 2013.
Navid et al., "The effect of ultraviolet lasers on conversion of methane into higher hydrocarbons," Laser and Particle Beams, 31, 481-486, 2013.
Schriver et al., "Graphene as a Long-Term Metal Oxidation Barrier: Worse Than Nothing", ACS Nano, vol. 7, No. 7, pp. 5763-5768, 2013.
Hao, et al., "The Role of Surface Oxygen in the Growth of Large Single-Crystal Graphene on Copper", Science, vol. 342, pp. 720-724, 2013.
Liu, et al., "Ultrathin high-temperature oxidation-resistant coating of hexagonal boron nitride", Nature Communications 4, 2541, published Oct. 4, 2013.
Luntz et al., "Review Article: Dynamics of methane dissociation of transition metals," J. Vac. Sci. Technol. A 35(5), 2017.
Akins, R., et al., "Effect of thickness on PDLC electro-optics", Proc. SPIE, 1665, liquid Crystal Materials, Devices, and Applications, 280 (Jun. 15, 1992); doi: 10.1117/12.60396.
Challa, S., et al., "Thermal induced phase separation of E7/PMMA PDLC system", Journal of Thermal Analysis, 45: 1297-1312 (1994).
Huang et al., "Grains and grain boundaries in single-layer graphene atomic patchwork quilts", vol. 469, Nature, Jan. 20, 2011, 5 pages.
Malik, M., et al., "Effect of Nematic Liquid Crystals on Optical Properties of Solven Induced Phase Separated PDLC Composite Films", Indian Journal of Science and Technology, 5(10): 3440-3452 (2012).

\* cited by examiner

● Center of laser spot

● Nucleation Sites    FIG. 3A

FIG 10

ORDERED GROWTH OF LARGE CRYSTAL GRAPHENE BY LASER-BASED LOCALIZED HEATING FOR HIGH THROUGHPUT PRODUCTION

RELATED APPLICATION(S)

This application is the U.S. National Stage of International Application No. PCT/SG2014/000540, filed Nov. 17, 2014, which designates the U.S., published in English, and claims the benefit of U.S. Provisional Application No. 61/904,993, filed Nov. 15, 2013. The entire teachings of the above applications are incorporated herein by reference.

BACKGROUND OF THE INVENTION

Large scale synthesis of graphene by copper-based chemical vapor deposition (CVD) methods are considered a potential route for graphene commercialization. Unfortunately, CVD graphene films consist of many small domains of graphene crystals that are stitched together. These resulting graphene has defective domain boundaries, and the average domain size remains in the 10-100 micrometer size range.

The properties of polycrystalline materials are often dominated by the atomic structure of their domain boundaries rather the single crystal domains themselves. Such polycrystalline graphene sheets are inferior to single domain graphene because grain boundaries can add resistance and random variation in uniformity. The multi-domain structure of polycrystalline graphene severely degrades its electrical and thermal conductivity as well as its mechanical and chemical properties. When such films are strained, grain boundaries increase the electrical resistance and make such films brittle and porous. These properties severely limit their potential for use in flexible touch panels and/or as gas barrier films (e.g., flexible gas barrier films).

Current processes for manufacturing graphene are inadequate because they produce graphene with the deficiencies described above. For example, growing graphene on a non-ideal substrate can increase the number of defects. Impurities on the substrate act as nucleation sites for graphene crystal seed, resulting in uncontrolled growth. CVD techniques can also yield random crystallization and growth of graphene. In other words, the graphene crystal size and location is uncontrolled. Accordingly, there is a need for processes for growing graphene that is more crystalline and has more predictable crystalline boundaries, thereby enabling device design that can be duplicated for mass production.

Additionally, CVD processes can be very slow (e.g., approximately 1 day for a 1 cm$^2$ crystal of graphene). One challenge for CVD techniques is the integration of high throughput manufacturing techniques with the high temperature requirement of the CVD chamber. Typically, the entire CVD chamber is heated to a high temperature (up to approximately 1,000° C.). The flammable gas environment can damage the equipment if it comes into contact with air during sample loading or unloading, which leads to slow processing. Additionally, substrates need to be cooled slowly since non-uniform temperature drops over a large substrate can results in a warped substrate. Since cooling is faster at the edges of the substrate than the center, an environment having too large a temperature difference can yield non-uniform temperatures of the substrate. Therefore, the substrate cannot be immediately moved into a cool environment, which slows down the production rate and can be a limiting factor for commercial-scale production. Additionally, the substrate cannot be rolled upon itself of stacked upon itself within the growth system without damaging the graphene. Accordingly, there is a need for processes for growing graphene that are fast enough to support commercial-scale production.

SUMMARY OF THE INVENTION

A method of making an ordered graphene structure includes exposing a substrate to a laser beam to locally melt a portion of the substrate, exposing the substrate to a laser beam in the presence of a gaseous carbon source to form a nucleation site for a graphene crystal, and either a) moving either the substrate or the laser beam relative to the other, or b) decreasing the laser beam power, in order to increase the size of the graphene crystal, thereby forming an ordered graphene structure. The laser beam can be moved relative to the substrate by decreasing the size of the laser beam. The ordered structure can be a plurality of columns, hexagons, or quadrilaterals. Each ordered structure can have a single crystal of graphene. The quadrilateral is a trapezoid. The trapezoid can be a rectangle. The rectangle can be a square. The carbon source can be methane. The method can further include exposing the substrate to a plurality of laser beams by diffracting a laser beam with a diffraction grating or an optical lens or by exposing the substrate to a plurality of laser beams from a plurality of lasers. The method can also include providing a rigid support at the grain boundary. The method can also include heating a substrate to a temperature near, but below, the melting point of the substrate. The method can also exposing the substrate to a laser beam in the presence of a carbon source and hydrogen gas to form a nucleation site for a graphene crystal providing a rigid support at the grain boundary. Exposing the substrate to a laser beam to locally melt a portion of the substrate can drive impurities away from locally melted portion. The method can also include forming a polymer coating on the ordered graphene structure to form a coated graphene structure. The polymer can be formed on one side of the graphene structure or on both sides of the graphene structure. The polymer can be direct coated or laminated onto the graphene structure. The method can further include stacking or rolling the coated graphene structure. The method can be performed within a chamber, including the polymer coating.

An ordered graphene structure can include a plurality of graphene crystals shaped as a plurality of columns, a plurality of hexagons, or a plurality of quadrilaterals. The quadrilateral can be a trapezoid. The trapezoid can be a rectangle. The rectangle can be a square.

Described herein is a method of making a coated graphene structure. The method includes exposing a substrate to a laser beam to locally melt a portion of the substrate; exposing the substrate to a laser beam in the presence of a carbon source to form a nucleation site for a graphene crystal; either a) moving either the substrate or the laser beam relative to the other, or b) decreasing the laser beam power, in order to increase the size of the graphene crystal, thereby forming an ordered graphene structure; forming a polymer coating on the ordered graphene structure to form a coated graphene structure; and stacking or rolling the coated graphene structure.

Described herein is an apparatus for growing graphene. The apparatus includes a chamber housing a substrate, a laser arranged to direct a laser beam onto the substrate, a means for providing a gaseous carbon source to the chamber, a substrate handling mechanism adapted for holding a substrate, and a means for applying a protective coating. The substrate handling mechanism is positioned within the chamber.

The methods of producing graphene described herein can create ordered graphene structures, which provide a number of improvements. The ordered graphene structures can have larger grain sizes and reduced polycrystallinity. Reducing the number of nucleation sites on the substrate can reduce the number of graphene grains (reduced polycrystallinity). Additionally, when there are fewer nucleation sites, each grain can grow to a larger size before merging with adjacent grains and forming a grain boundary. The grain boundaries can be ordered, rather than randomly located, and the resulting graphene structure can be less resistive because grain boundaries can increase resistivity and the claimed process can yield, on average, fewer grain boundaries across a fixed length.

Laser-based local heating processes only heat the substrate in the vicinity of the laser spot, which is typically a small fraction of the total surface area. Since most of the substrate remains cool, it acts as a heat sink to quickly cool the relatively small laser-heated region after the laser has been moved. Warping of the substrate is less likely to occur due to the small area of heating and the rapid cooling, which can enable much faster processing. Furthermore the use of local heating means that overall the substrate temperature is well below the melting point of a protective polymer coating, thereby enabling the application of the protective polymer coating to the graphene coated substrate shortly after graphene growth. The method also allows for the integration of a continuous polymer film with the substrates. The polymer film can be applied by direct coating or lamination. The polymer film can be applied on a first side while the graphene contacts the substrate. In addition, a polymer film can be applied to a second side of the graphene by removing the graphene from the substrate and subsequently coating the second side with a polymer film. This method can also enable the winding up or stacking of graphene films within the same growth chamber without damaging the graphene layer. A polymer coating can be a protective coating, a transfer film coating, or both. In addition, the entire chamber does not need to be heated, which enables safer operating conditions for commercial-scale production.

Graphene having the improved properties described above may be useful in a variety of applications. For example, multitouch capacitive panels require patterning conductive stripes having both an approximate 100 micron width and pitch.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Graphene is a two dimensional sheet of carbon that has highly desirable physical properties. Graphene is the strongest material known having a Young's modulus of 0.5-1 TPa, yet it is extremely flexible and not brittle. Graphene can be transferred onto any flat or irregular shaped surface and graphene-coated, flexible, supporting substrates can be easily bent into any shape required.

A graphene crystal is a form of carbon having a characteristic periodic, repeating pattern. As described herein, a single graphene crystal is created at the location where a metal substrate is exposed to a laser beam. A graphene layer refers to a larger, two-dimensional graphene product made by expanding the size of a single graphene crystal. Graphene crystals produced by the methods described here can be much larger than crystals produced by chemical vapor deposition. For example, graphene crystals produced by the methods described herein can be in excess of 100 μm in length. Additionally, the methods described herein can be used to grow very long and thin graphene crystals (e.g., 10 μm wide with a long length), which can be useful for thin graphene electronic channels or interconnections.

Additionally, crystal size can depend on the type of laser used. For example, infrared type lasers are generally higher power and can produce graphene having larger crystals than a visible light laser. Additionally, continuous wave lasers can produce graphene having larger crystals than pulsed lasers.

Substrates on which graphene can be formed include, but are not limited to, nickel, copper, scandium, titanium, vanadium, manganese, iron, cobalt, ruthenium, platinum, germanium, silicon carbide (SiC), and copper-nickel alloys. Substrates can include also non-metal or non-oxide substrates, such as Germanium and other semiconductor materials. The substrate can be freestanding, such as a foil or wafer, or it can be sputtered/coated on a supportive substrate (e.g., a supporting substrate that is conducting, insulating, an oxide, or crystalline wafer). Thus, a wide variety of substrates can be used, so long as the substrate can be treated with the laser to become more crystalline and provide a catalytic surface for the conversion of carbon atoms into a graphene lattice.

Gaseous carbon sources can include carbon containing gases, such as hydrocarbon gases, including methane, ethane, propane. Gaseous carbon source can also include vaporized liquids, such as methanol, ethanol, or propanol.

A metal substrate can be heated to a temperature near, but below, the melting point of the metal substrate. The metal substrate can then be exposed to a laser beam to locally melt a portion of the metal substrate, which in some cases can drive impurities away from recrystallized metal (e.g., the impurities remain within the metaled portion). Next, the metal substrate can be exposed to a laser beam in the presence of methane gas, optionally in the present of hydrogen gas, to form a nucleation site for a graphene crystal. Then, either the metal substrate or the laser beam can be moved relative to the other to increase the size of the graphene crystal, thereby forming an ordered graphene structure.

Local melting refers to melting a portion of a substrate at a region where a laser beam contacts the substrate. Typically, the region of local melting expands radially outward from the point where the laser beam contacts the substrate. The size of the region of local melting varies depending on the substrate material, the power of the laser beam, the laser beam wavelength, whether the laser beam is pulsed or continuous, and the laser beam profile (i.e., the shape of the beam).

The patterns of each graphene layer can be parallel or orthogonal to each other. For example, the first graphene layer and the second graphene layer can each be patterned to form bars or lines in the graphene layer. The bars or lines of the first graphene layer can be placed perpendicular to bars or lines of the second graphene layer to form a grid bar structure. Alternatively, the first graphene layer and the second graphene layer can each be patterned with a diamond shape. The diamonds shapes of the first graphene layer can be placed perpendicular (e.g., in the X-direction) to the diamond shapes of the second graphene layer (e.g., in the Y-direction) to form and X-Y diamond grid.

As used herein, approximately refers to values that are within 25% of the stated value. In other embodiments, approximately refers to values that are within 15% of the stated value. In other embodiments, approximately refers to values that are within 10% of the stated value. In other embodiments, approximately refers to values that are within 5% of the stated value. In other embodiments, approximately refers to values that are within 1% of the stated value.

Figure 1:
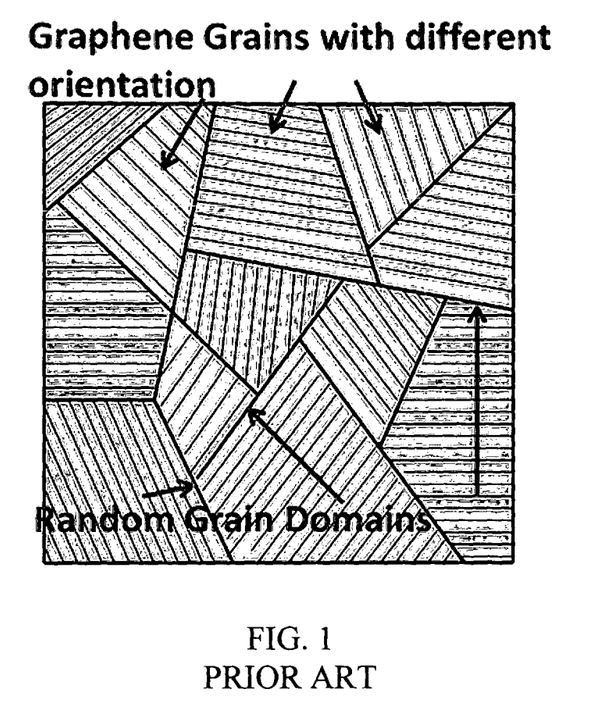
FIG. 1 is a schematic illustrating the growth of graphene crystal grains in prior art methods.

FIG. 1 illustrates graphene produced by prior art processes. As can be seen, the graphene grains are grown with a variety of orientations, and the boundaries where adjacent domains intersect have a variety of orientations and lengths. In general, the process does not produce an ordered graphene structure.

Figure 2A:
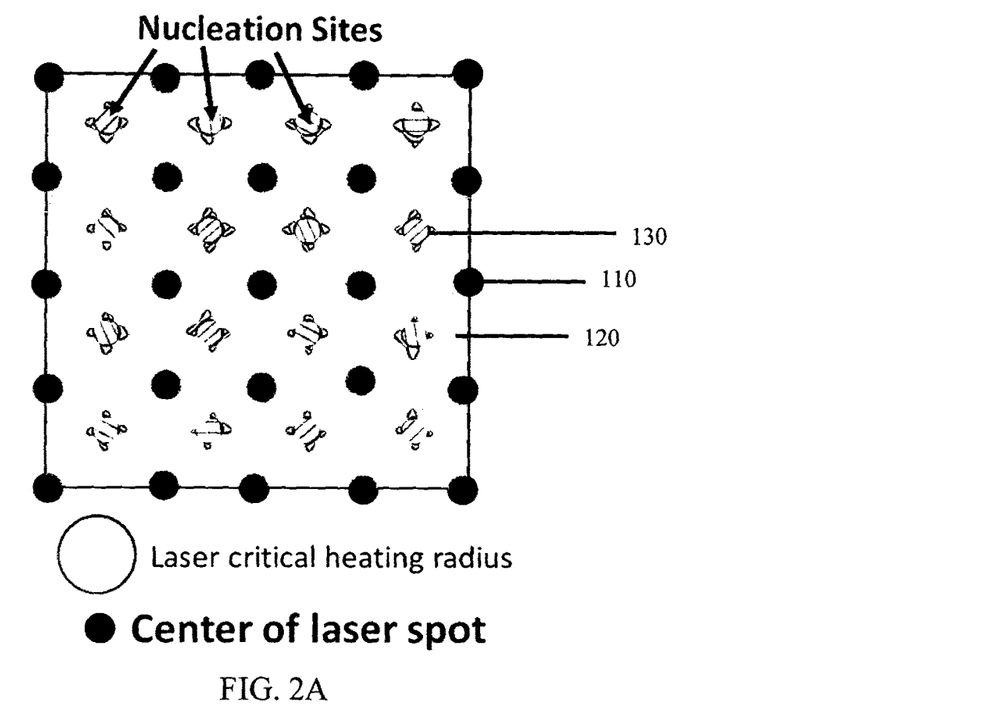
FIG. 2A is a schematic illustrating the laser critical heating radius on a substrate.
Figure 2B:
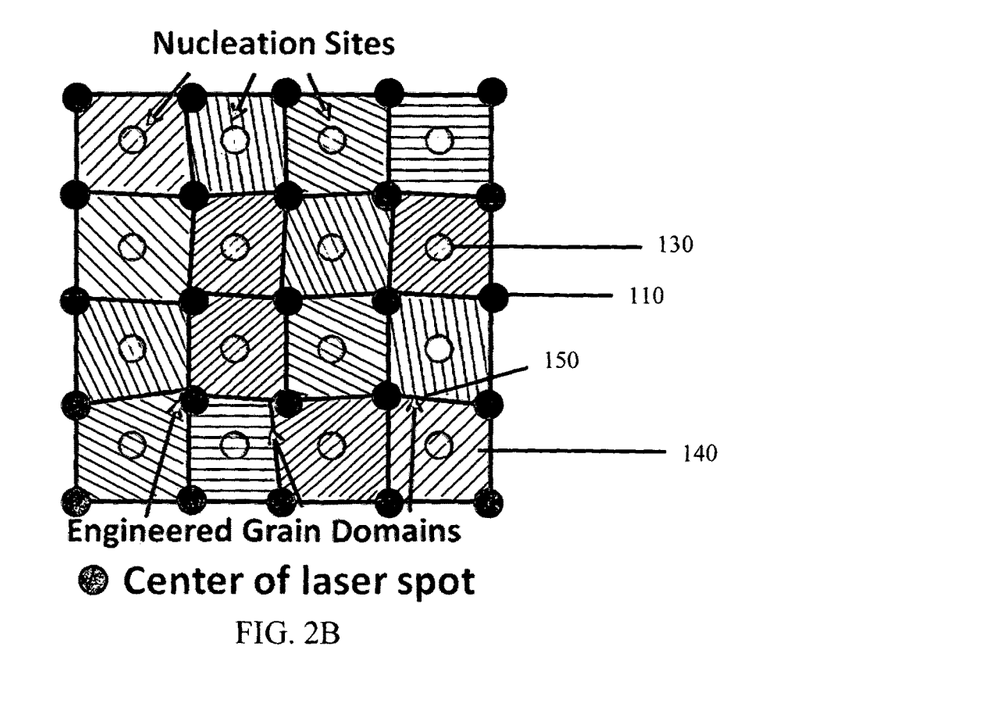
FIG. 2B is a illustrating the engineered graphene grain domains relative to the laser-induced nucleation sites.

FIG. 2A illustrates the laser critical heating radius on a substrate. The laser beam impacts the substrate at the center of the laser spot 110, and a heated area expands radially outward 120. Graphene grows from the nucleation seed 130 to form graphene grains 140. The laser is not exposed over the seed but at a point in between. Graphene does not form from the center of the laser spot 110 but at the circumference of the heating zone 120. Graphene is subsequently grown as the laser beam power is decreased, which decreases the circumference of the heating zone 120. FIG. 2B illustrates the resulting graphene product. The graphene grains 140 are more ordered, and the grain domains 150 are engineered and structured into regular, repeating patterns. As illustrated, the grains are quadrilateral, and approximately rectangular, in shape, and some of the grains are approximately square in shape.

During substrate preparation, the impurities within the substrate diffuse to and remain within in the metal melt within the heat zone as it shrinks. This result in the surrounding area free of impurities and all impurities are concentrated at the center of the laser spot.

Figure 3A:
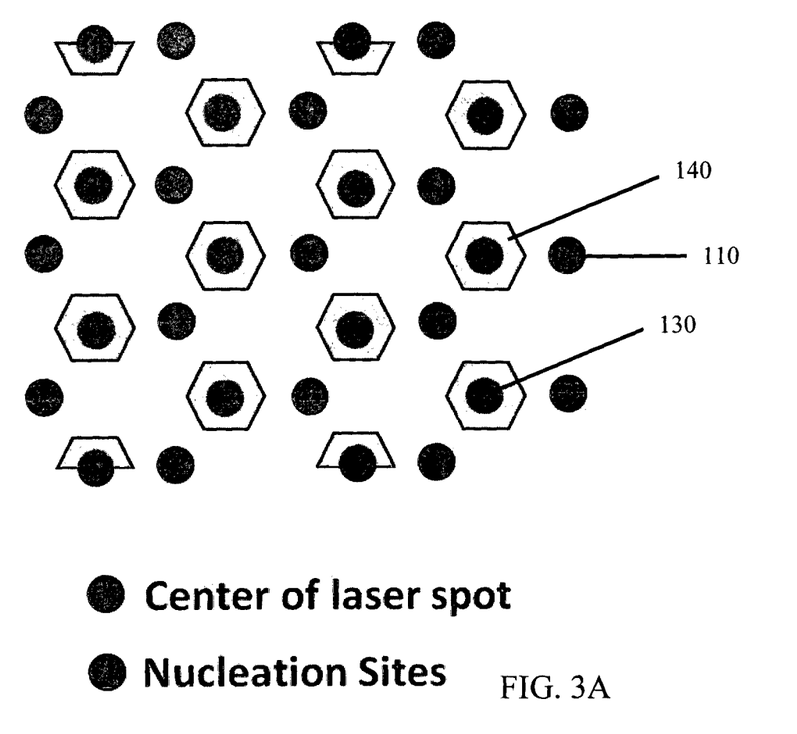
FIG. 3A is a schematic illustrating an alternate arrangement of the laser beam on a substrate.
Figure 3B:
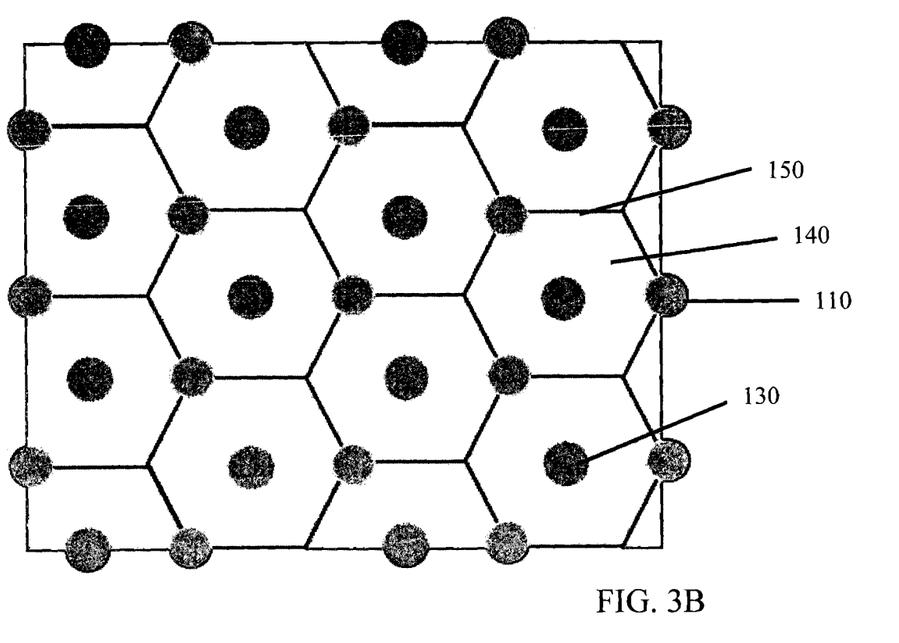
FIG. 3B is a schematic illustrating the growth of graphene when the laser beam is arranged according to FIG. 3A.

FIG. 3A illustrates an alternative arrangement of the laser beam 110 on a substrate, which can be used to form hexagonal crystals of graphene 140, as shown in FIG. 3B.

Figure 4:
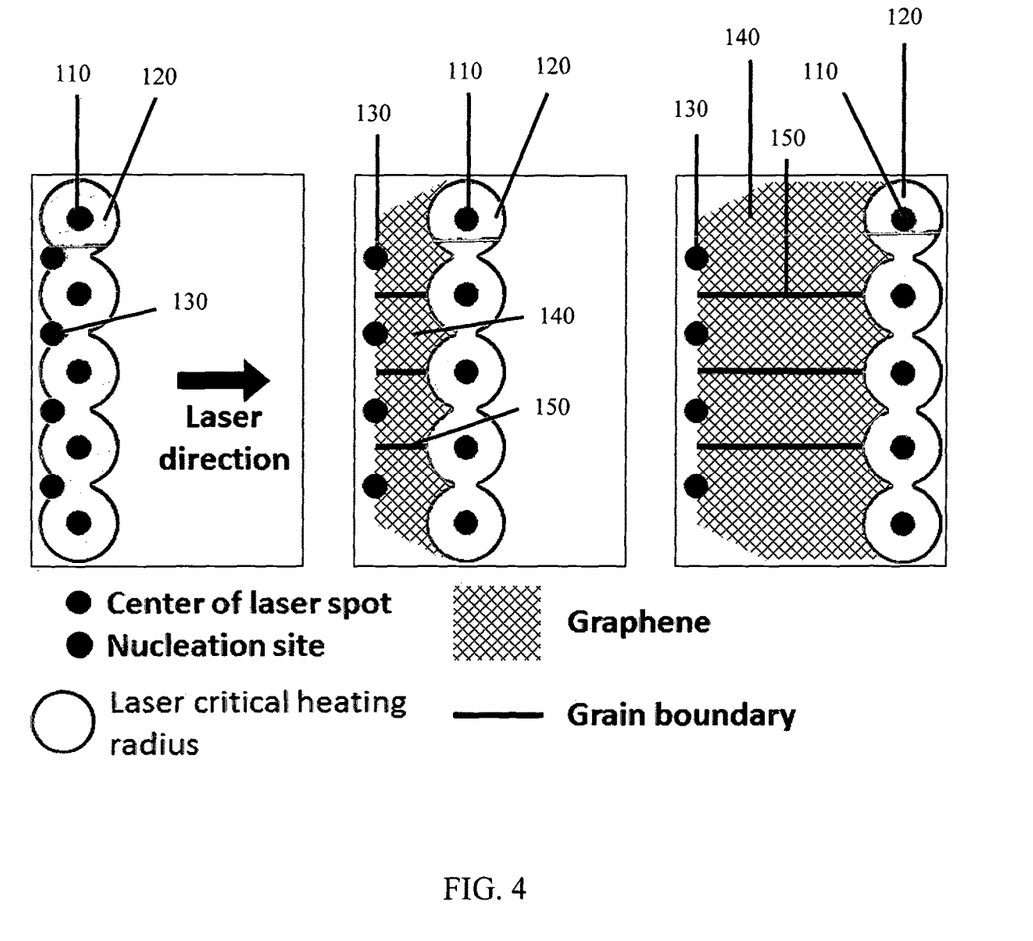
FIG. 4 is a schematic illustrating the growth of graphene in a columnar array.

FIG. 4 illustrates another alternative arrangement of the laser beams 110 on a substrate, which can be used to form columns of graphene crystals. As the laser beams are moved in a linear direction across the substrate, graphene 140 forms first at the nucleation site 130 and then as the locally melted area cools: The result is columns of graphene separated by grain boundaries 150.

In one embodiment, the ordered graphene structure can be a plurality of hexagonals. In one embodiment, the ordered graphene structure can be a plurality of quadrilaterals. Preferably, the quadrilateral is a trapezoid. Preferably, the trapezoids are rectangles. Preferably, the rectangles are squares. The quadrilaterals of the plurality of quadrilaterals need not have identical dimensions. The ordered graphene structure can also be a plurality of columns, sometimes referred to as stripes. The rectangles, squares, and columns need not be precisely hexagonal, rectangular, square, or columnar. For example, the graphene domains of FIG. 2B are quadrilaterals. Some are approximately trapezoidal, some are approximately rectangular, and some are approximately square. Imperfect recrystallization may result in crystals having less than idea geometries.

Different crystal structure orientations of the substrate can promote graphene growth at different rates. For example, the crystal plane on the copper surface can be favorable to the (100), (110), or (111) orientation. Graphene will grow slightly different on each surface type, and the following growth features can be impacted: graphene crystal growth rate, probability of graphene nucleation seed forming, graphene crystal size, graphene crystal shape (e.g., hexagonal or circular or star), incidence of multilayer islands within a single layer of graphene, and/or number of defects within the crystal grown. Preferably, the substrate on which the graphene is grown has the same crystal plane orientation over the entire surface, even if the crystal grows in different directions. A substrate having a dominant crystalline plane orientation over its surface is more likely to occur where there is a heat gradient for a directional crystal growth. Such substrates can reduce the number of defects in the resulting graphene.

A wide variety of lasers can be used to locally heat and control the substrate temperature. The laser can have a wavelength ranging from ultraviolet (UV) to infrared (IR). The duration of time during which the laser impacts a location on the substrate, as well as the speed of the laser, will affect the size of the thermal gradient during radiation. Typically, the thermal gradient expands from the laser spot to a radius of about 10 μm to about 10 mm. Multiple lasers can be used be used simultaneously. The laser source can produce either continuous wave laser radiation or pulsed laser radiation at a wavelength and pulse duration suitable to establish a temperature profile in the growth substrate. The optics of the apparatus can control and steer the laser beam from the source to the substrate. In some embodiments, a plurality of lasers can be used simultaneously to localize the defects at the intersection of grain boundaries. The laser spot is at the intersection of the grain boundaries, and substrate impurities can be localized at this spot. The impurities can induce defects in the graphene crystals. Additionally, the crystal mismatch at the grain boundaries can promote defects to graphene grown in this region. Advantageously, graphene produced by the methods described herein grows over a single crystal region of the prepared substrate, and therefore the substrate grain boundary matches with the grown graphene grain boundary. In other words, the graphene defects can be limited to the grain boundaries. In other embodiments, a single laser can provide a plurality of laser beams by using a grating or mask upstream in the laser beam path or by using an optical lens.

The graphene layer can be unpatterned or patterned. As used herein, patterning means to cut and remove the unwanted regions of a whole graphene sheet to create well-defined graphene structures. Patterning can be used to make numerous arrangements and patterns in the graphene structures. Non-limiting examples include one or more of the following patterns: crossbars, bars, stripes, circles, random diamonds, rectangles, spheroids, parallelograms, or hatched. If the graphene substrate is patterned, a laser or electron beam can be used to pattern the graphene substrate while it is still attached to the metal template. The graphene substrate can also be annealed by using a laser or by simply heating the graphene under an atmosphere of hydrogen-argon ($H_2$—Ar) gas mixture. Annealing of the graphene can be used to enhance the quality of the graphene substrate by reducing irregularities at the intersection of adjacent graphene crystals. The same laser can be used to both pattern and anneal the graphene substrate. The laser power required for the annealing process is lower than that used for the patterning process. For example, the graphene layers can be patterned in an interlocking diamond shape structure. Alternatively, the graphene layers can be patterned in a grid bar structure. The graphene can also be patterned so that all domain boundaries are parallel to the stripes and can be etched away.

The processes described herein do not necessarily require heating the entirety of a large chamber along with the chemicals necessary for chemical vapor deposition. Thus, the processes described herein provide safer conditions for high throughput processing. Only the portion of the substrate in the vicinity of the laser spot is heated, which is a small fraction of the total substrate area.

Figure 9:
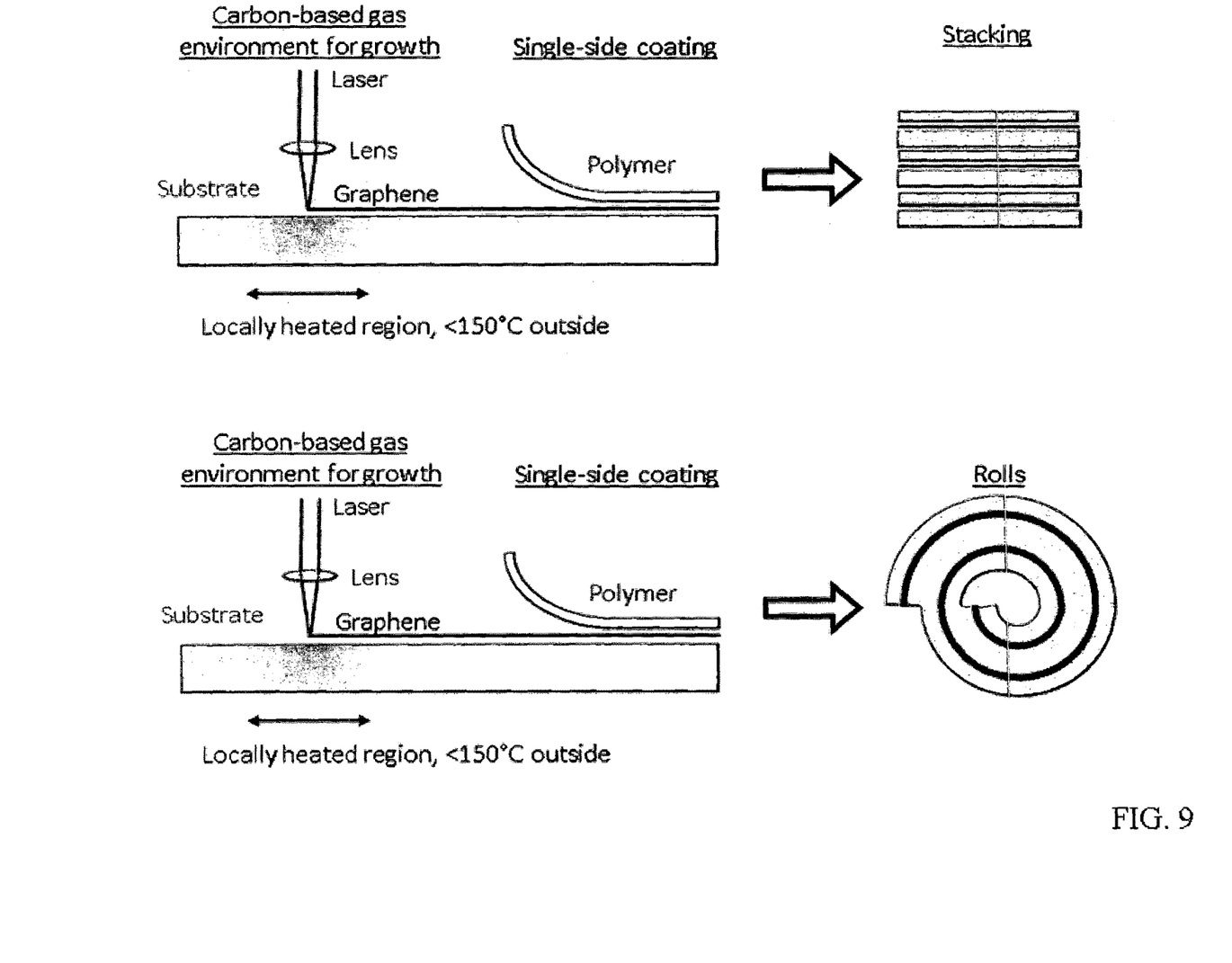
FIG. 9 is a schematic illustrating the use of a laser to create single-sided polymer-coated graphene that can be stacked or rolled.

Graphene produced by the methods described herein allows for large scale manufacturing with high throughput. Since the substrate remains close to room temperature, except for the portion immediately surrounding the location where the laser beam contacts the substrate, a protective coatings can be applied to the graphene shortly after graphene synthesis. Graphene can be easily damaged upon frictional contact with another material, and thus coatings can protect the graphene during the production, long-term storage, or post-production. As illustrated in FIG. 9, graphene can be grown on a substrate within a growth chamber. Only a portion of the substrate is heated by the laser (the locally heated region), Subsequently, a single-sided or double-sided coating can be applied to the graphene, which can then be stacked or rolled for storage. Since the processes described herein do not require bulk heating and subsequent cooling of the substrate, the process can be simplified and performed faster. For example, the coating can be applied to the substrate directly within the growth chamber, enabling the winding of the film within the chamber and thereby increasing throughput by significantly reducing processing time and costs. Alternatively, the graphene-coated substrate sheets can be fed in a linear fashion into an adjacent chamber without any active cooling or time delay, which otherwise would be needed to bring down substrate temperature. In addition, the substrate handling mechanisms, such as a roll-to-roll mechanism or other automated feeding mechanism, can be included within the chamber since the chamber temperature does not need to be elevated.

EXEMPLIFICATION

The following describes an example procedure for creating an ordered graphene structure.

Chamber Setup

Figure 5:
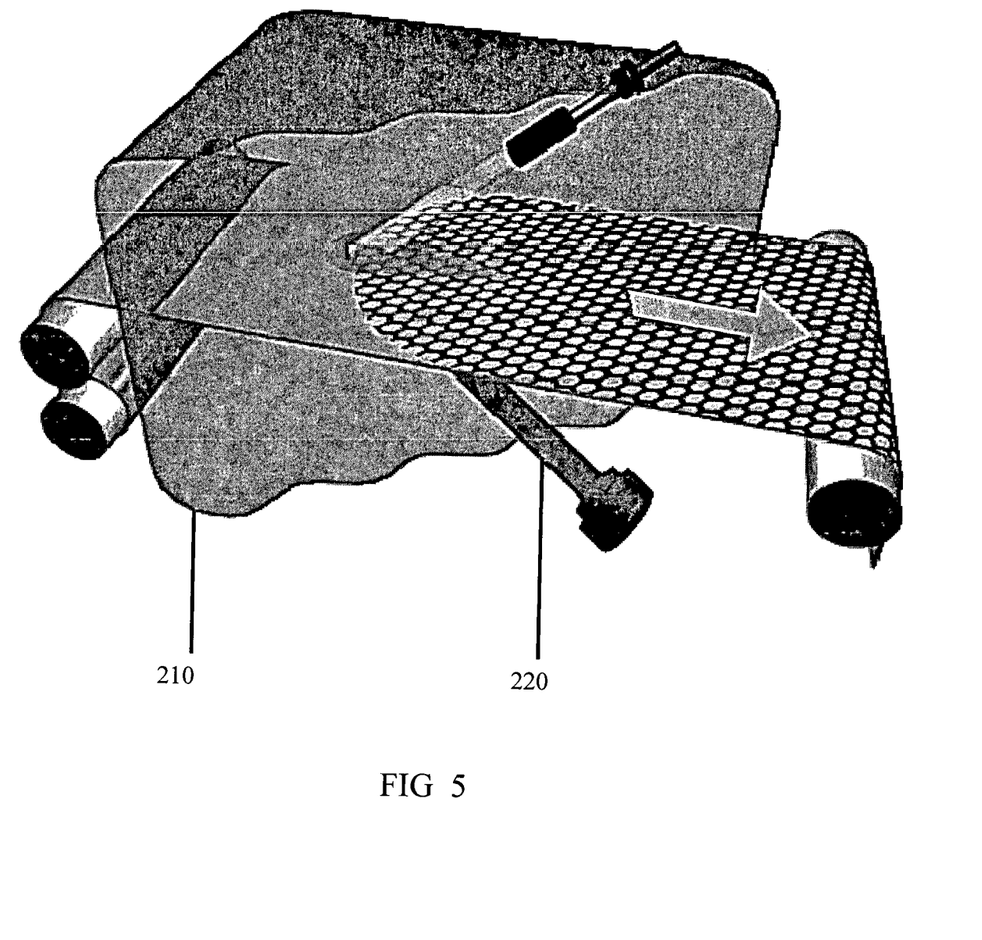
FIG. 5 is a schematic illustrating a laser growth chamber.

Referring to FIG. 5, the graphene growth apparatus includes a laser source, optics guiding the laser beam from the source to the substrate, a processing chamber, and a mechanism to handle, the growth substrate. As illustrated, the laser impacts the substrate from below and the gas is targeted to a location from above. However, other arrangements can be implemented. For example, the laser can impact the substrate from the top, and the gas can be uniformly distributed throughout the chamber. The mechanism to handle the growth substrate can be entirely contained within the growth chamber. Alternatively, the substrate may be introduced into the growth chamber via suitable load locks or other feeding mechanisms. In one embodiment, the substrate can be delivered into the growth chamber via a roll-to-roll mechanism. In another embodiment, the mechanism can be a movable sample stage upon which the substrate is placed and rastered.

A laser source and associated optics can be used to produce a laser spot on the substrate. The laser can achieve a high temperature at the center of the laser spot, which creates a heat gradient extending radially outward from the laser spot toward the edge of the substrate. Depending on the laser, this heat gradient profile can be shaped to meet the growth requirement. For example, a lens can be used to shape the heat gradient profile. One particular example is an "optical homogenizer," which can be used to change a Gaussian beam intensity profile into a flat uniform intensity beam profile. By changing the intensity profile, the heat gradient profile will change as well. The laser can have a uniform or Gaussian beam profile that will change the heat gradient within the laser spot. The source or the optical elements in the laser beam path can be controlled in order to control the fluence of the laser beam pulse. The appropriate laser source and optical elements can be selected to establish a temperature profile and heat gradient in the substrate.

The choice of laser depends on the properties of the substrate and wavelength of the laser. For example copper has a greater thermal conductivity than a germanium semiconductor. Thus, the same laser spot will cause copper to have a lower surface temperature as compared to a germanium semiconductor because the heat dissipates away faster from the laser spot to the rest of the substrate. In other words, the copper substrate is a better heat sink to the localized heating. In addition, the heat gradient for copper radially outwards from the center of the laser spot is gentler for copper than germanium due to the greater thermal conductivity for copper.

The wavelength of the laser will affect the amount of energy absorbed by the specific substrate and hence the maximum temperature and length scale of the heat gradient suitable to grow graphene. As described above, the substrate can be any material on which graphene can be grown;

including, but not limited to, nickel, copper, scandium, titanium, vanadium, manganese, iron, cobalt, ruthenium, platinum, germanium, silicon carbide (SiC), and copper-nickel alloys. Different materials have different wavelength absorption spectra. Thus, different metals can absorb more or less strongly at different wavelengths. For example, if a substrate has a strong absorption at the wavelength of the laser, the substrate will absorb more energy and have a higher surface temperature. If the absorption is poor, the energy is either reflected or absorbed further in the bulk, which means that the heat profile will be further into the depth of the substrate as compared to surface heating.

In the chamber, the optics is such that the laser beam can cover the entire substrate by rastering or by moving of the substrate. Through the rastering process, the laser should remain in focus and maintain its shape in order to maintain the heat gradient profile. The laser beam is introduced into the growth chamber via appropriate optical ports. Reactive gases can be introduced into the chamber in a controlled manner at atmospheric or low pressure such that a homogeneous concentration of the reactive gases can be maintained. For graphene growth, a carbon containing gas, such as methane, is introduced. Optionally, hydrogen gas can also be introduced. The chamber environment can be further controlled with an inert gas such as argon.

Laser Purification of the Substrate

Figure 6:
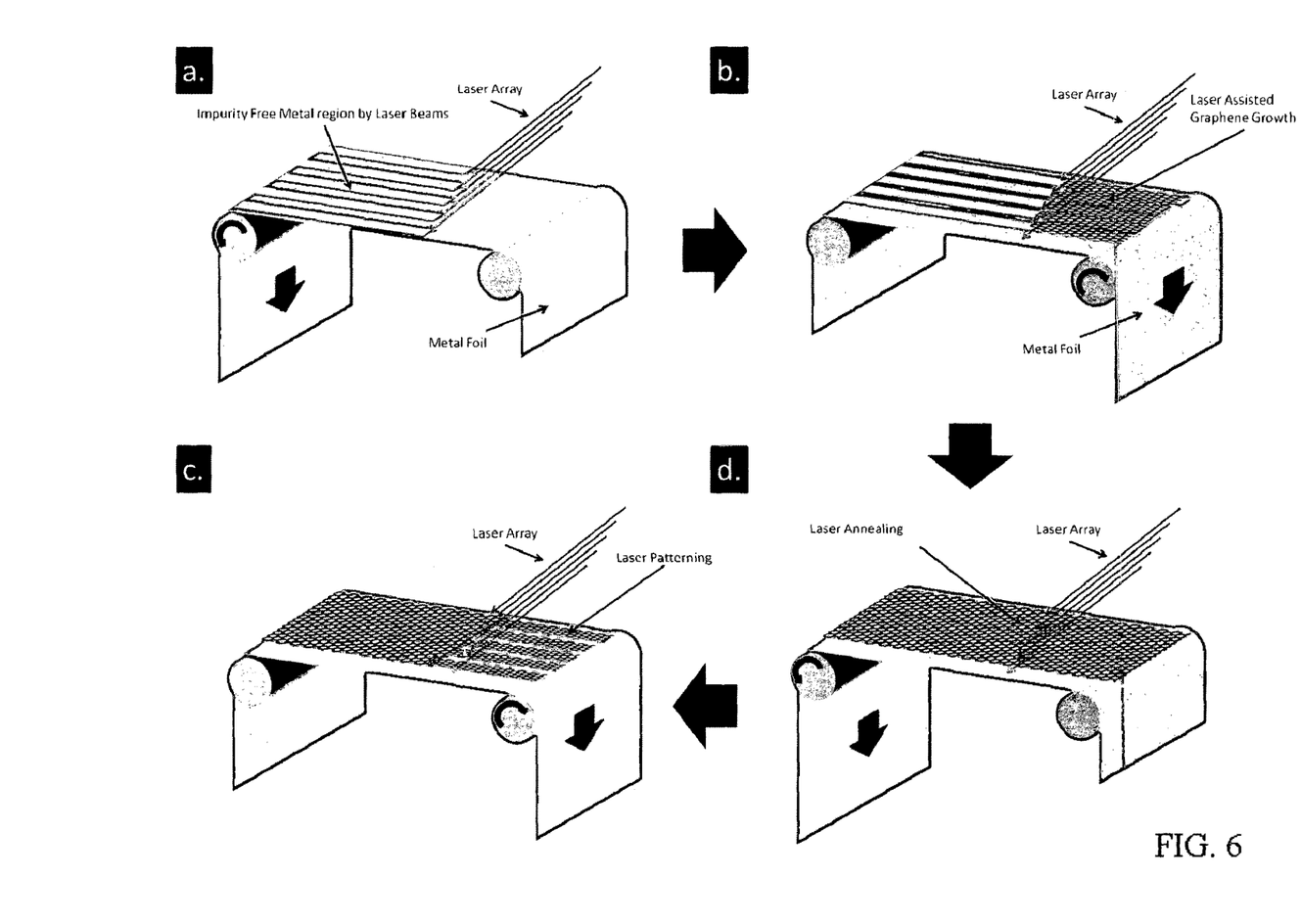
FIG. 6A is a schematic illustrating laser irradiation of a substrate.
FIG. 6B is a schematic illustrating the use of a laser to grow graphene.
FIG. 6C is a schematic illustrating the use of a laser to pattern graphene.
FIG. 6D is a schematic illustrating the use of a laser to anneal graphene.

Referring to FIG. 6, float zone crystal growth of the catalytic substrate is initiated by establishing a large temperature gradient at the laser spot. In a float zone, a localized melted region gradually moves along the substrate. As the melted region moves, it leaves behind a much higher crystallinity substrate with fewer impurities, which remain within the melted region. Thus, the local melt created by the laser is then moved, either by reducing area of the laser beam (e.g., by reducing the power of the laser beam to reduce the critical heating radius) or by rastering. Consequently, a crystalline path is formed behind.

The beam fluence, beam shape, and substrate heater are controlled so that the substrate locally melts. Beam fluence (intensity) can be controlled at the laser source or by an attenuator within the optical beam path. Beam fluence affects the maximum temperature of the substrate at the center of the laser spot. Pulse shape can be modulated through the use of an "optical homogenizers" and/or specialized optics. If the beam has a Gaussian shape, it is possible that only the center of the laser spot is melted by the laser. In contrast, a flat profile can melt a larger area under the laser spot.

For example, the melting point for copper is 1,083° C. at sea level. The temperature decreases radially outward from the center of the laser spot, and melting does not occur at a radius sufficiently distant from the laser spot. By moving the laser or by gradually reducing the intensity of the laser, the melted substrate will begin to solidify, and the solidification will increase as the melted area decreases radially towards the center of the laser spot. This solidification produces crystalline regions while driving impurities towards the hottest spot (at the center of the laser spot) by diffusive migration. Thus, the crystalline direction and the composition of the substrate material is controlled. Referring to FIG. 1, nucleation sites are created by selective crystallization of the metal substrate. In addition to the laser-based purification process, the substrate can also be pre-cleaned by a suitable plasma or heat treatment.

For crystallization of a large area substrate, the laser is rastered at suitable speed across the substrate surface. For large area, the substrate can be moved related to the laser in a zig-zag manner to cover the full area of the substrate. An ordered substrate crystal array can be created by stepping the laser spot/substrate after each exposure. In some embodiments, the rectangular array is a square. Alternatively, a column can be created by moving the substrate in one direction (or raster) during exposure.

The laser spot can be controlled so that the gradient of the fluence across the spot can be shaped for optimized melting/substrate crystallization process in combination with suitable rastering patterns.

The size of the substrate crystals can be varied by iterative approach of above described steps. For example, multiple laser passes may be required to obtain a high degree of crystallinity. Performing the local melting multiple times can improve the results.

Laser Assisted Nucleation and Growth

Carbon seed gas with suitable pressure and concentration can be introduced into the chamber. The substrate can be locally heated by controlling the laser fluence.

The heat gradient guides the growth of the graphene crystal and drives any remaining defects and grain boundaries. The growth occurs due to thermal decomposition of the carbon seed gas (e.g., methane) upon contact with the heated catalytic substrate. The growth tends to establish a thermal gradient so as to promote growth of a large, single crystal of graphene.

By varying the gaseous composition within the chamber, crystallization of the substrate can be optimized. Methane provides the carbon atoms for graphene growth. Therefore, too low of a partial pressure of methane will result in a very slow growth, or can even preventing graphene growth. A high pressure of methane can result in excessive carbon atoms that cause multilayer graphene or more unwanted nucleation sites to form. However, to intentionally form nucleation site of graphene seeds, a high methane pressure can be favorable for this step. Alternatively, to control the carbon amount, an inert gas (e.g., Argon) can be used to reduce the carbon fraction in the environment. Additionally, when hydrogen is present within the growth chamber, the preferred substrate crystal plan orientation can be different from a vacuum environment. Hydrogen can also act as a reducing gas to prevent oxide formation and remove oxygen from the substrate, thereby enabling a pure substrate and higher crystallinity.

Figure 7:
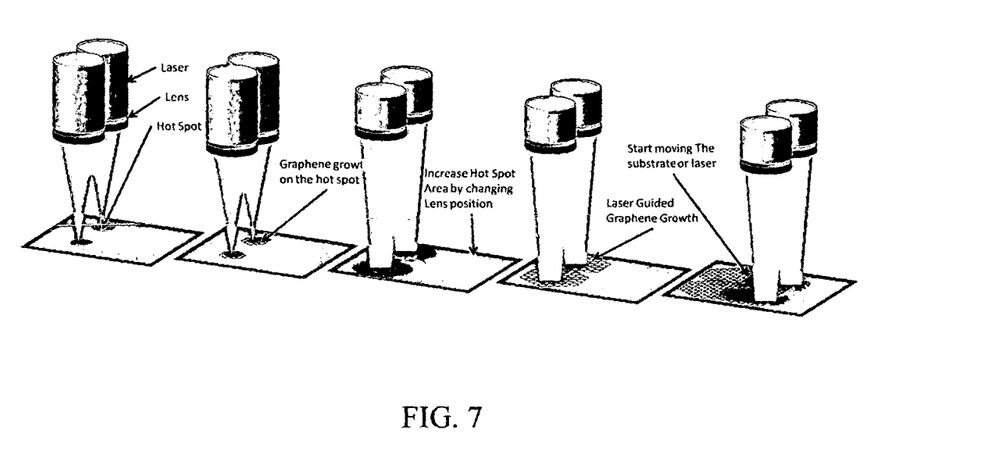
FIG. 7 is a schematic illustrating the use of a laser to trigger nucleation of graphene in a small spot.
Figure 8:
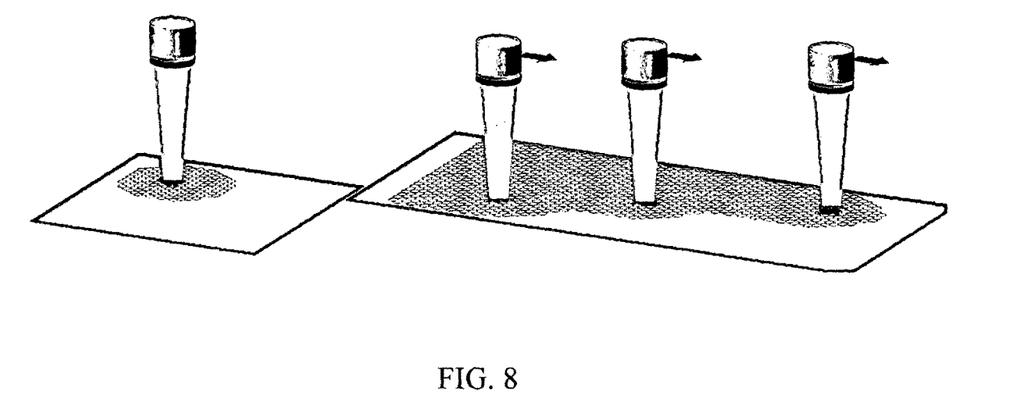
FIG. 8 is a schematic illustrating the use of a laser to create a single seed spot to create a large area single crystal graphene sheet.

Referring to FIGS. 7 and 8, the growth direction can be guided by increasing the spot size of the laser, and controlling the laser power. Similarly, the growth direction can be guided by moving either the laser or the metal foil relative to the other. Accordingly, it is possible, to grow graphene crystals having the shape of a line (e.g., a column), a square, a circle, or a spiral.

First, the laser square/line array can be used to locally melt a small spot on the substrate in the presence of high carbon seed gas. The carbon can dissolve within the melt and precipitate when the substrate solidifies. This carbon precipitate can form a graphene seed. The laser is then offset as in FIG. 2B to prepare for the graphene growth step. In the case of an arrays as illustrated in FIG. 2B, graphene can be grown in batches. For example, by using a 5×5 array of laser beams, a square array of graphene can be grown. Next, the 5×5 array of laser beam is moved to the next adjacent location to grow another square of graphene. These batches can be grown side-by-side such that the graphene at the interface will merge into a continuous larger sheet. In one embodiment, an array of laser line beams is rastered over a thin (typical tens of microns thick copper) metal foil to create column-shaped ordered substrates. If there are spaces between the parallel lines, a zig-zag back and forth of the substrate or laser can be required to cover the entire substrate.

With line arrays, the laser spots can be perfectly ordered in 1 row such that graphene will grow along the moving direction without any spaces between the parallel graphene lines, therefore enabling a large area graphene sheet. If there are spaces between the parallel graphene lines, the zig-zag of the substrate back and forth may be required to cover the entire substrate with a large area graphene sheet.

Laser Assisted Patterning

Post graphene growth laser patterning can be employed to yield a final shape on the substrate. Referring to FIG. 6, nucleation sites can be patterned in ways that are limited by the movement of the substrate and/or shape/size of the laser spot on the sample. Specifically, striped patterns (e.g., columns) or dot arrays of single nucleation sites (e.g., an ordered graphene structure having the shape of rectangles or squares) can be formed. The patterning of the nucleation sites is specific to the following graphene growth process step and the person skilled in the art will appreciate the need for optimizing the generation of nucleation sites for the respective graphene crystal growth.

For laser-patterning, the fluence of the laser is controlled so that it is higher than the ablation threshold for graphene on the respective substrate. A vacuum condition and/or inert gas can be injected into the growth chamber at a low pressure.

Application of Protective Coatings

Figure 10:
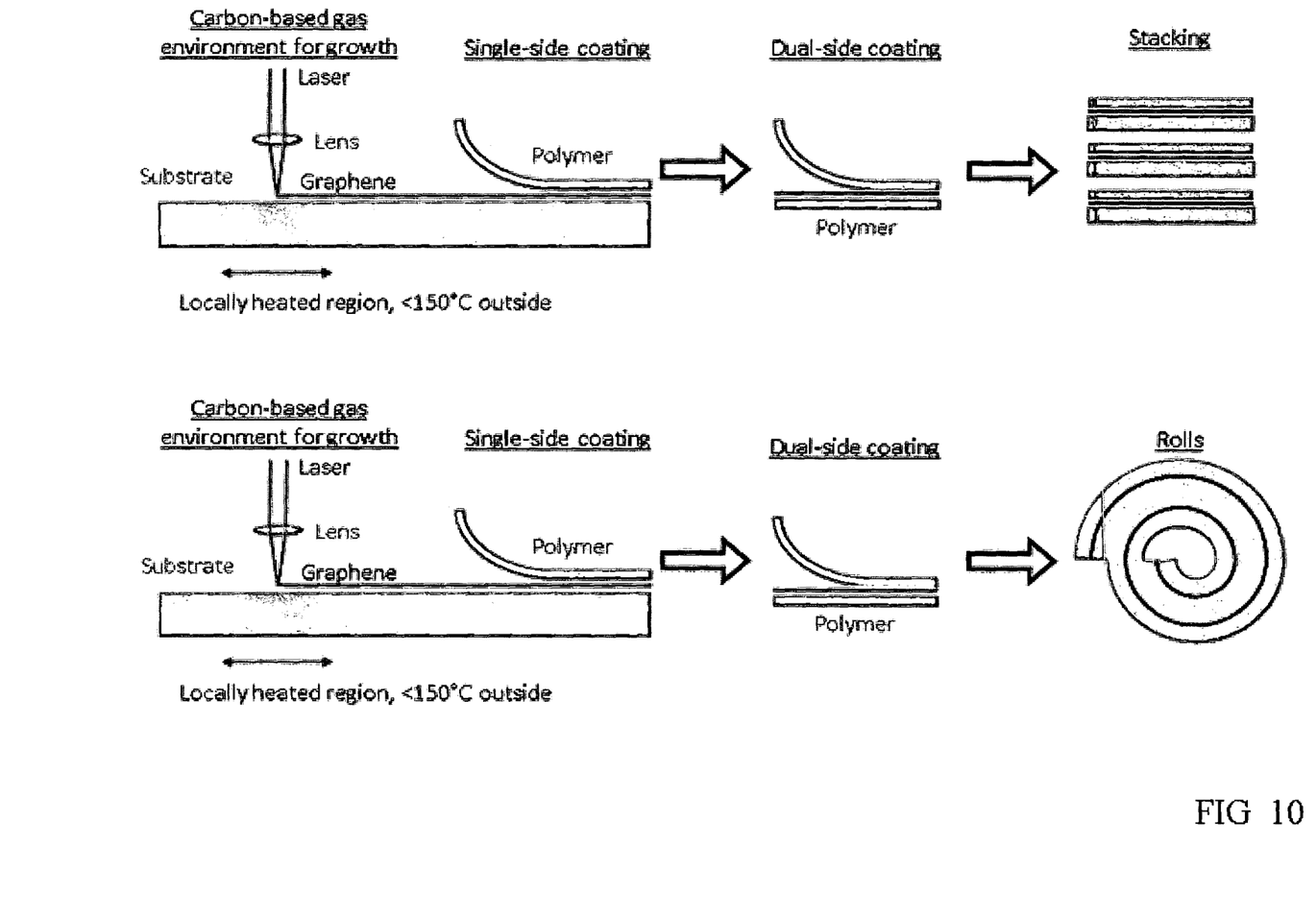
FIG. 10 is a schematic illustrating the use of a laser to create double-sided polymer-coated graphene that can be stacked or rolled

The methods described herein provide for enhanced coating procedures for protecting graphene films. Referring to FIGS. 9 and 10, a polymer layer that protects the graphene from mechanical alteration can be applied. The polymer layer can be coated on one or two sides. By applying a protective layer, the graphene layer can be protected when it is rolled or stacked for storage. Thus, graphene coated on one side can be either stacked or rolled, and graphene coated on both sides can also be either stacked or rolled. By coating the graphene, it can be rolled or stacked with less concern that the graphene will be mechanically damaged during the winding process.

Notably, the heat load on the substrate handling mechanism is decreased since the substrate can be locally heated by the laser. Additionally, due to the low temperature within the chamber, the coating operations can be performed as a sequential process within the clean atmosphere of the chamber. In general, the substrate should be below about 150° C. prior to applying a polymer protective coating. In other words, it is not necessary to move the substrate into a contaminated environment. After a protective coating has been applied to the graphene-coated substrate, it can be safely rolled or stacked upon itself. Since less time is necessary for the substrate to cool down, it is not necessary to wait as long before performing the coating steps, and thus the entire process can be performed more quickly.

The coating can be from a solution and dispersed over the graphene using standard methods, such as blade coating or bar coating. This coating can also be in the form of a polymer film or thermal release tape that is laminated on the graphene with a roller.

The polymer coated graphene can also be removed from the substrate and second polymer coating can be applied to the other side of the graphene, which can be either the same or different from the first coating, as illustrated in FIG. 10

INCORPORATION BY REFERENCE AND EQUIVALENTS

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method of making an array of graphene crystals on a substrate, the method comprising:
   irradiating the substrate with a plurality of laser beams to locally melt a portion of the substrate in the presence of a carbon source to form a nucleation site for a graphene crystal;
   offsetting the plurality of laser beams; and
   decreasing power of the plurality of laser beams while maintaining the substrate and plurality of laser beams stationary, in order to increase the size of the graphene crystal, thereby forming an array of graphene crystals.

2. The method of claim 1, wherein the plurality of laser beams irradiate the substrate at equidistant points of a hexagonal array of graphene crystals.

3. The method of claim 1, wherein the plurality of laser beams irradiate the substrate at points within a rectangular array.

4. The method of claim 1, further comprising providing a support at a graphene grain boundary.

5. The method of claim 1, further comprising heating the substrate to a temperature below the melting point of the substrate.

6. The method of claim 1, wherein irradiating the substrate comprises irradiating with at least three laser beams to locally melt a portion of the substrate and drive impurities away from the locally melted portion.

7. The method of claim 1, further comprising forming a polymer coating on the array of graphene crystals to form an array of coated graphene crystals.

8. The method of claim 7, wherein the polymer is direct coated or laminated onto the array of graphene crystals.

9. The method of claim 7, further comprising forming a stack or a roll of the array of coated crystals.

10. The method of claim 7, wherein the method is performed within a chamber.

11. The method of claim 1, wherein the plurality of laser beams irradiate the substrate at points along a straight line.

12. The method of claim 3, wherein the rectangular array is a square array.

* * * * *

UNITED STATES PATENT AND TRADEMARK OFFICE
CERTIFICATE OF CORRECTION

PATENT NO. : 10,815,584 B2
APPLICATION NO. : 15/032219
DATED : October 27, 2020
INVENTOR(S) : Barbaros Özyilmaz and Chee Tat Toh It is certified that error appears in the above-identified patent and that said Letters Patent is hereby corrected as shown below:

In the Claims

In Claim 9, Column 12 at Line 56 delete "coated crystals." and insert --coated graphene crystals.--.

Signed and Sealed this
Twenty-ninth Day of December, 2020

Andrei Iancu
*Director of the United States Patent and Trademark Office*